United States Patent
Enomoto et al.

(10) Patent No.: US 7,583,807 B2
(45) Date of Patent: Sep. 1, 2009

(54) SET VOLUME CONTROL DEVICE FOR ON-VEHICLE AUDIO SYSTEM

(75) Inventors: Kenichiro Enomoto, Niiza (JP); Takeo Tokunaga, Niiza (JP); Yasuo Oishi, Niiza (JP); Yuji Aihara, Niiza (JP)

(73) Assignee: Honda Access Corporation, Niiza-shi (JP)

( * ) Notice: Subject to any disclaimer, the term of this patent is extended or adjusted under 35 U.S.C. 154(b) by 935 days.

(21) Appl. No.: 11/085,608

(22) Filed: Mar. 22, 2005

(65) Prior Publication Data

US 2005/0232439 A1    Oct. 20, 2005

(30) Foreign Application Priority Data

Mar. 23, 2004    (JP)    ............................. 2004-085354

(51) Int. Cl.
- H04B 1/00 (2006.01)
- H03G 3/20 (2006.01)
- H03G 3/00 (2006.01)
- H04B 1/06 (2006.01)
- H01H 19/00 (2006.01)
- H03M 1/22 (2006.01)
- H03K 17/94 (2006.01)

(52) U.S. Cl. .................... 381/86; 381/94.1; 381/57; 381/107; 381/108; 455/238.1; 200/19.07; 34/35; 34/13

(58) Field of Classification Search ............... 381/86, 381/94.1, 57, 102–109; 455/238.1; 200/19.07; 341/35, 13; 700/94

See application file for complete search history.

(56) References Cited

U.S. PATENT DOCUMENTS

| 4,558,460 | A | * | 12/1985 | Tanaka et al. ................ 381/86 |
| 5,034,984 | A |   | 7/1991 | Bose |
| 5,745,057 | A | * | 4/1998 | Sasaki et al. ................ 341/35 |
| 5,907,622 | A |   | 5/1999 | Dougherty |

FOREIGN PATENT DOCUMENTS

| JP | 2002-362241 | 12/2002 |
| JP | 2002362241 A | * 12/2002 |

* cited by examiner

*Primary Examiner*—Devona E Faulk
(74) *Attorney, Agent, or Firm*—Westerman, Hattori, Daniels & Adrian, LLP.

(57) ABSTRACT

The controller changes the low vehicle speed region set volume according to an operational input to the volume control switch within a first volume setting range set up in advance when the volume control switch is operated in the low vehicle speed region, and changes the high vehicle speed region set volume according to an operational input to the volume control switch within a second volume setting range set up in advance when the volume control switch is operated in the high vehicle speed region. A lower limit of the second volume setting range is set higher than an upper limit of the first volume setting range. Thus, it is possible to accurately control the volume of the audio system and improve feeling of volume change.

6 Claims, 10 Drawing Sheets

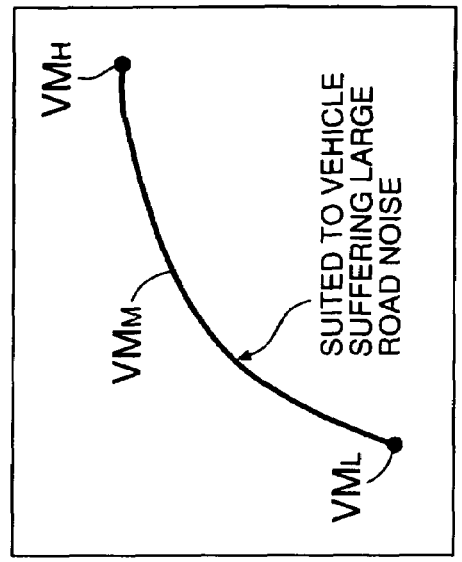
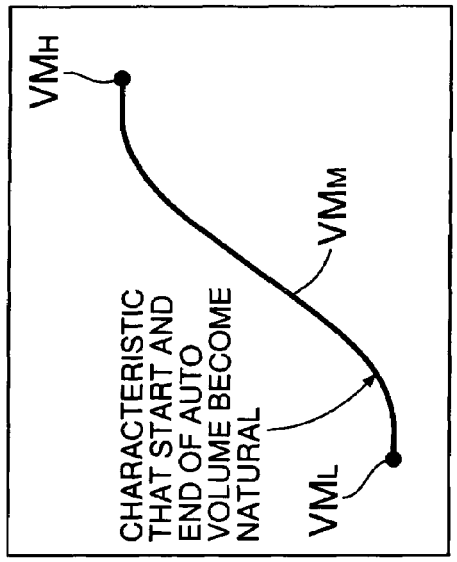
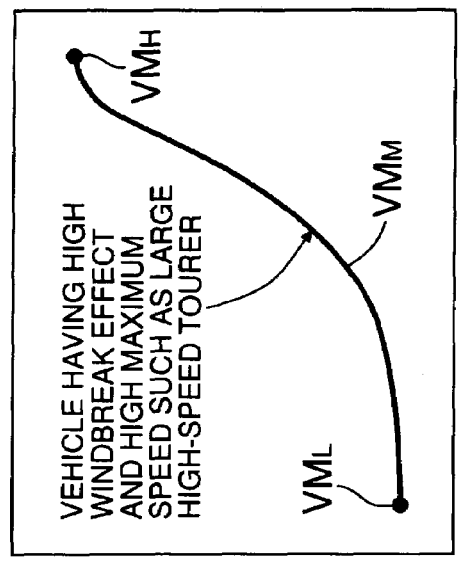

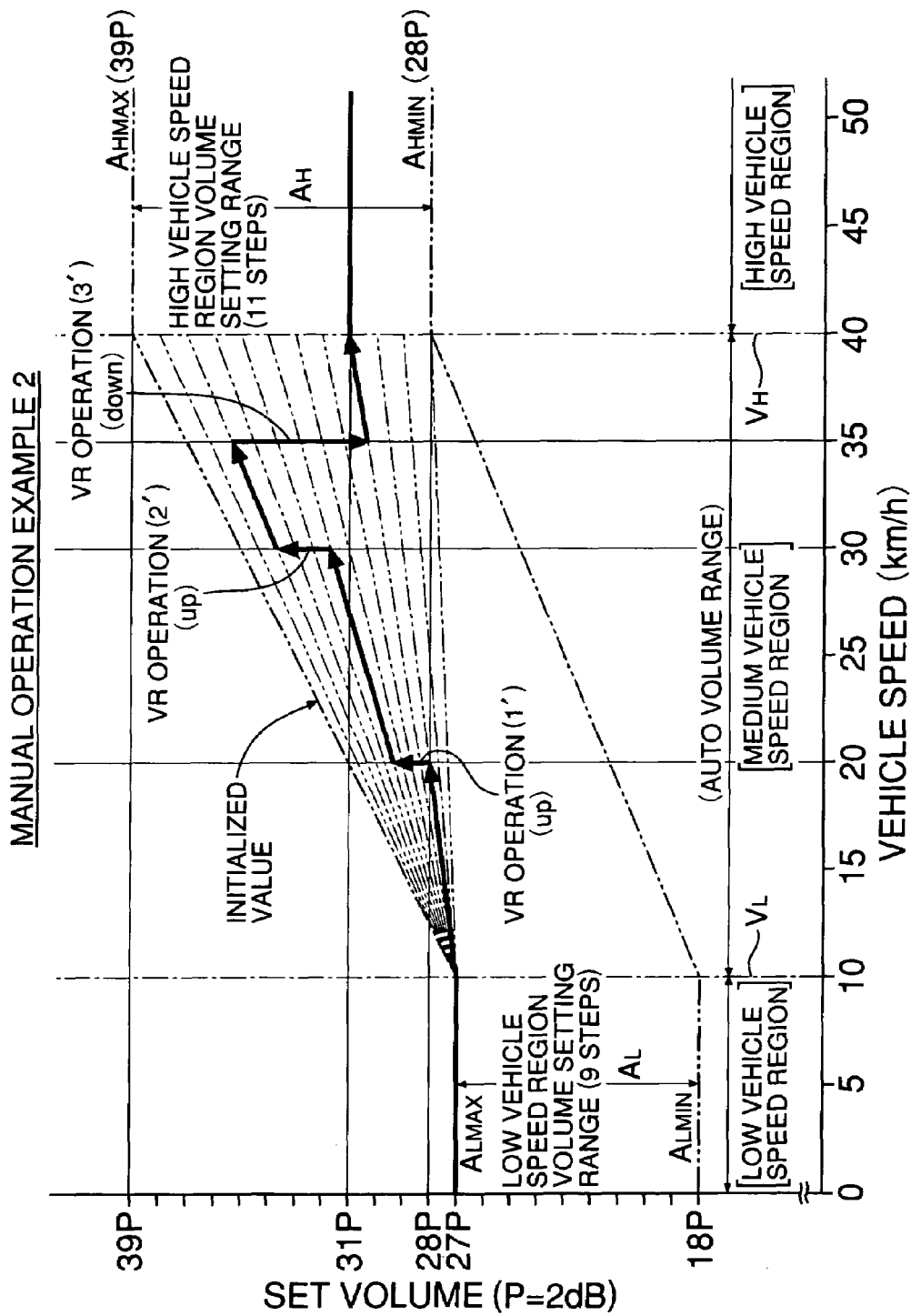

SET VOLUME CONTROL DEVICE FOR ON-VEHICLE AUDIO SYSTEM

RELATED APPLICATION DATA

The Japanese priority application No. 2004-85354 upon which the present application is based is hereby incorporated in its entirety herein by reference.

BACKGROUND OF THE INVENTION

1. Field of the Invention

The present invention relates to a set volume control device for an on-vehicle audio system capable of automatically controlling a set volume of the audio system according to vehicle speed.

2. Description of the Related Art

Japanese Patent Application Laid-open No. 2002-362241 discloses an on-vehicle audio system capable of automatically controlling a set volume of the audio system according to vehicle speed.

In this conventional device, the set volume of the audio system is automatically increased as the vehicle speed increases and is decreased as the vehicle speed decreases in order to keep sound of the audio system sufficiently audible even if traveling noise increases when running at high speed. Therefore, there are problems as follows: depending on the set volume before changing the vehicle speed, the volume becomes unnecessarily high or low after changing the speed, so that a vehicle occupant feels uncomfortable; if the volume of the audio system becomes unnecessarily high when stopping or running at low speed, thereby hindering comfortable listening; and power of a battery is wastefully consumed.

SUMMARY OF THE INVENTION

The present invention has been achieved in view of the above-mentioned circumstances, and has an object to solve the problems of the conventional device with a simple structure.

In order to achieve the above-mentioned object, according to a first feature of the invention, there is provided a set volume control device for an on-vehicle audio system having a set volume changer for increasing and decreasing a set volume of the audio system, and capable of controlling the set volume changer to automatically control the set volume of the audio system according to vehicle speed, the device further comprising: a vehicle speed detector for detecting vehicle speed; a volume control switch to which a vehicle occupant can arbitrarily give an operational input; and a controller for controlling the set volume changer based on a vehicle speed detected by the vehicle speed detector and the operational input to the volume control switch so that the set volume of the audio system becomes a low vehicle speed region set volume fixed independently of vehicle speed change in a low vehicle speed region of an upper limit vehicle speed or less; becomes a high vehicle speed region set volume fixed independently of the vehicle speed change in a high vehicle speed region of a lower limit vehicle speed or more; and changes according to the vehicle speed change along a predetermined medium vehicle speed region set volume change line connecting the low vehicle speed region set volume and the high vehicle speed region set volume in a medium vehicle speed region between the low vehicle speed region and the high vehicle speed region, wherein the controller changes the low vehicle speed region set volume according to an operational input to the volume control switch within a first volume setting range set up in advance when the volume control switch is operated in the low vehicle speed region, and changes the high vehicle speed region set volume according to an operational input to the volume control switch within a second volume setting range set up in advance when the volume control switch is operated in the high vehicle speed region, and wherein a lower limit of the second volume setting range is set higher than an upper limit of the first volume setting range.

With this arrangement, it is possible to continuously connect the low vehicle speed region set volume and the high vehicle speed region set volume through a volume change line for gradually increasing the volume according to increase in the vehicle speed so that feeling of volume change is improved. Besides, in the medium vehicle speed region, the feeling of the volume with respect to traveling noise becomes generally constant irrespective of the change in the vehicle speed, resulting in no uncomfortable feeling. Furthermore, when the volume control switch is operated in the low vehicle speed region, the low vehicle speed region set volume is changed according to an operational input to the volume control switch within the first volume setting range set up in advance correspondingly to the low vehicle speed region. Furthermore, when the volume control switch is operated in the high vehicle speed region, the high vehicle speed region set volume is changed according to the operational input to the volume control switch within the second volume setting range set up in advance correspondingly to the high vehicle speed region. Therefore, in the low vehicle speed region and high vehicle speed region, a vehicle occupant cannot change the volume so as to exceed the upper limit of the volume setting range corresponding to the respective vehicle speed region, so that it is possible to accurately control the volume to be comfortably listenable in each of the vehicle speed regions. Furthermore, as the lower limit of the second volume setting range is higher than the upper limit of the first volume setting range, there is no unnatural situation, such as increase in the set volume when reducing the vehicle speed from the high vehicle speed region to the low vehicle speed region. Thus, it is possible to naturally increase and decrease the volume as the vehicle speed becomes high and low, and it is also possible to narrow down the set volume as much as possible in the low vehicle speed region. Therefore, the audio sound is comfortably listenable even when stopping or running at low speed, and a load on a battery is reduced by avoiding wasteful consumption of power of the battery when stopping or running at low speed.

According to a second feature of the present invention, in addition to the first feature, the controller changes the high vehicle speed region set volume according to the operational input to the volume control switch within the second volume setting range when the volume control switch is operated in the medium vehicle speed region, and changes the medium vehicle speed region set volume change line so as to connect the high vehicle speed region set volume (after it is changed) and the low vehicle speed region set volume.

With this the arrangement, when the volume control switch is operated in the medium vehicle speed region, it is possible to change the high vehicle speed region set volume according to the operational input to the volume control switch within the second volume setting range. Also, it is possible to newly change the medium vehicle speed region set volume change line based on the high vehicle speed region set volume which has been changed and the low vehicle speed region set volume which was not changed.

According to a third feature of the present invention, in addition to the first feature, the controller changes the low vehicle speed region set volume according to the operational input to the volume control switch within the first volume setting range when the volume control switch is operated in the medium vehicle speed region, and changes the medium vehicle speed region set volume change line so as to connect the low vehicle speed region set volume (after it is changed) and the high vehicle speed region set volume.

With this arrangement, when the volume control switch is operated in the medium vehicle speed region, it is possible to change the low vehicle speed region set volume according to the operational input to the volume control switch within the first volume setting range. Also, it is possible to newly change the medium vehicle speed region set volume change line based on the low vehicle speed region set volume which has been changed and the high vehicle speed region set volume which was not changed.

According to a fourth feature of the present invention, in addition to the first feature, the controller changes the high vehicle speed region set volume according to the operational input to the volume control switch within the second volume setting range and the low vehicle speed region set volume within the first volume setting range, respectively, when the volume control switch is operated in the medium vehicle speed region, and changes the medium vehicle speed region set volume change line so as to connect the high vehicle speed region set volume and the low vehicle speed region set volume (after it is changed).

With this arrangement, when the volume control switch is operated in the medium vehicle speed region, it is possible to change the low vehicle speed region set volume and high vehicle speed region set volume respectively according to the operational input to the volume control switch. Also, it is possible to newly change the medium vehicle speed region set volume change line based on the low vehicle speed region set volume and high vehicle speed region set volume which have been changed.

According to a fifth feature of the present invention, in addition to the first, second or third feature, upon turning up or down operation of the volume control switch, the controller confirms at least once that the same operation is performed when a predetermined time elapses after the turning up or down, and then handles the operational input as effective.

With this arrangement, by performing the above-described switch operation check, it is possible to accurately judge a switch operating intention of the vehicle occupant so as to keep the set volume from being changed in vain by an instantaneous operation error.

According to a sixth feature of the present invention, in addition to the first, second or third feature, in the medium vehicle speed region set volume change line, at least opposite ends thereof are formed as curve portions connected together smoothly to the straight lines of the high vehicle speed region set volume and the low vehicle speed region set volume, respectively, and both the curve portions are connected smoothly through a straight line or a curve.

With this arrangement, it is possible to variously set the set volume change line in the medium vehicle speed region corresponding to vehicle characteristics and preference of a user.

The above-mentioned object, other objects, characteristics, and advantages of the present invention will become apparent from explanation of preferred embodiments, which will be described in detail below by reference to the attached drawings.

BRIEF DESCRIPTION OF THE DRAWINGS

FIGS. 5A to 5C are graphs showing changes of characteristics of the set volume (set volume change lines) with respect to vehicle speed changes in a medium speed region.

FIG. 10 is a volume setting operation characteristic diagram corresponding to FIG. 4 showing another example of the manual operation.

DESCRIPTION OF THE PREFERRED EMBODIMENTS

Next, the first embodiment of the present invention will be described based on FIGS. 1 to 5.

Figure 1:
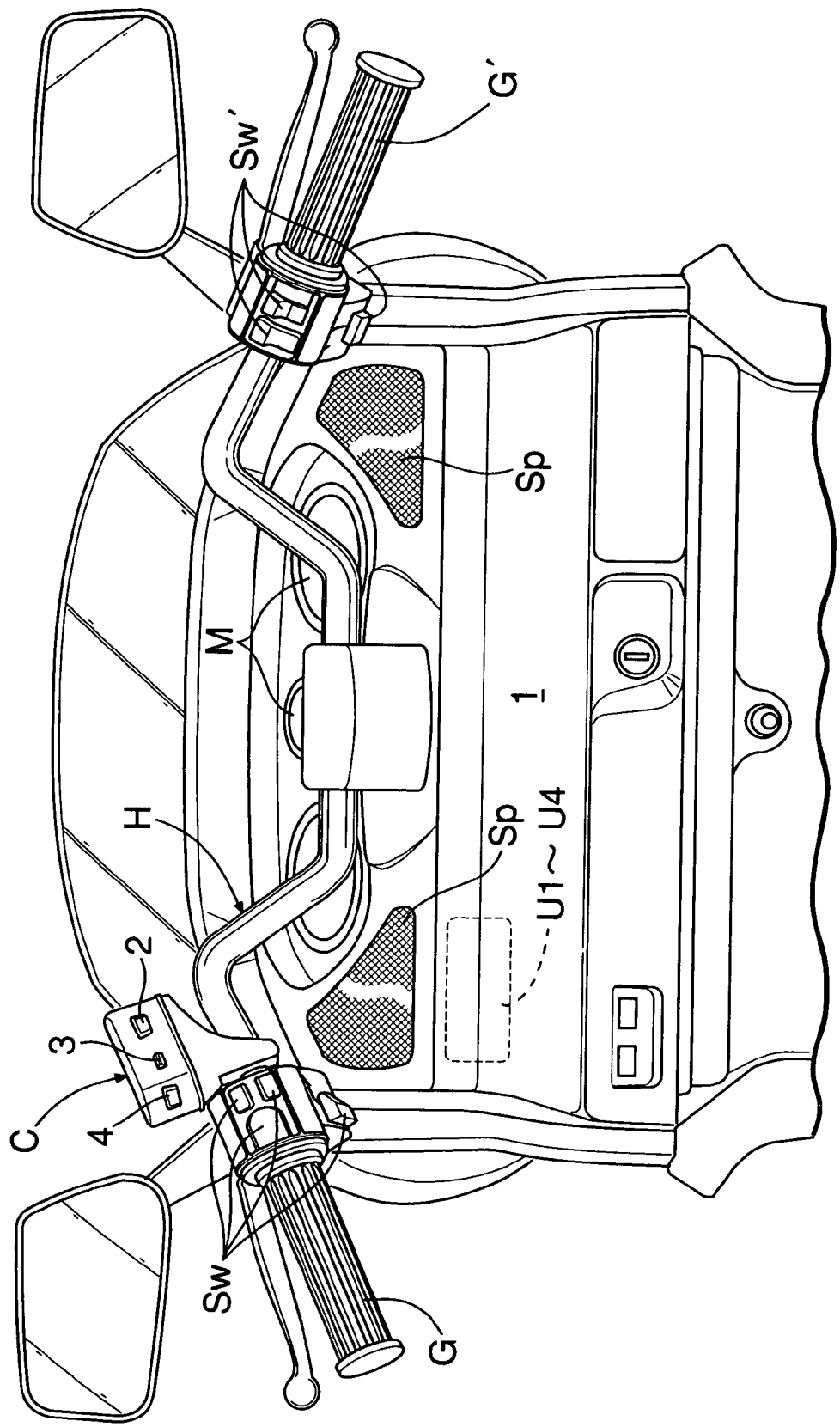
FIG. 1 is a perspective view showing a set volume control device according to a first embodiment of the present invention and its surroundings in a two-wheeled motor vehicle.

In FIG. 1, a steering control handle H in a bar-handle shape is steerably placed above an instrument panel 1 having various meters M and speakers Sp in a driving seat of a two-wheeled motor vehicle.

There are right and left switch groups Sw' and Sw for operating various on-vehicle electric components provided at bases of right and left bar-handle grips G' and G of the steering control handle H, respectively. Furthermore, a volume controller box C annexed to an on-vehicle audio system AU is provided in proximity to one bar-handle grip G.

The volume controller box C includes: a power switch 2; a volume control switch 3 as a setting operation means with which a vehicle occupant can arbitrarily perform an operational input to control increase and decrease of a set volume of the audio system AU corresponding to the volume of sound generated by the system AU; and a mute switch 4 for arbitrarily and temporarily reducing the set volume to zero or a predetermined feeble volume. In the shown example, the volume control switch 3 comprises an up-down switch capable of increasing the set volume by upward operation and decreasing it by downward operation. However, the volume control switch 3 is not limited to the shown example, and a rotary switch or a slide switch may also be used.

Figure 2:
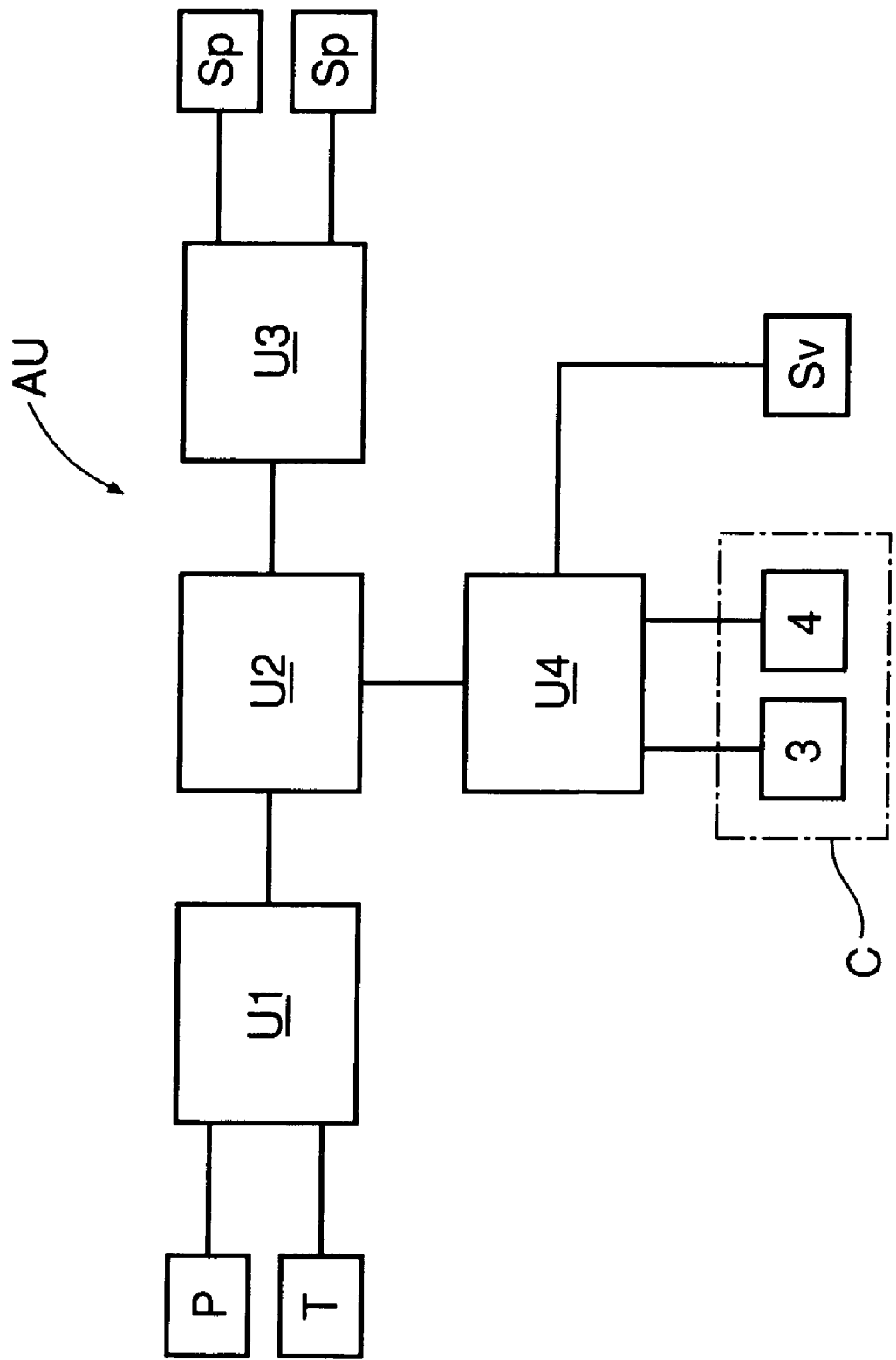
FIG. 2 is a control block diagram of the set volume control device of an audio system.

As schematically shown in FIG. 2, the audio system AU comprises: a player P and a tuner T for CD, MD or the like which are placed at proper locations of a vehicle body; an initial amplifying section U1 for amplifying and/or attenuating audio signals from the players P and tuner T; a volume control section U2 for processing output signals from the initial amplifying section U1 in order to control the increase and decrease of the volume; a power amplifying section U3 for amplifying and/or attenuating output audio signals from the volume control section U2 to output it to the speakers Sp to generate sound; a microcomputer section U4 connected to the volume control section U2 for the sake of controlling actuation of the volume control section U2; and a power supply section (not shown) for supplying power from an on-vehicle battery to the initial amplifying section U1, volume control section U2, power amplifying section U3 and microcomputer section U4. The player P and tuner T have operating sections (not shown) for manually operating these devices individually placed thereon. The initial amplifying section U1 and/or the power amplifying section U3 may comprise, in its part or in its entirety, an attenuating circuit which attenuates a signal (voltage or electric current) input thereto and output it.

The microcomputer section U4 has the volume control switch 3 and mute switch 4 of the volume controller box C and a vehicle speed detector Sv for detecting vehicle speed connected thereto. As will be described later, if the volume control switch 3 is operated in a low vehicle speed region, the microcomputer section U4 changes a low vehicle speed region set volume $VM_L$ within a first volume setting range $A_L$ set up in advance correspondingly to a low vehicle speed region according to the operational input to the volume control switch 3, and if the volume control switch 3 is operated in a high vehicle speed region, it changes a high vehicle speed region set volume $VM_H$ within a second volume setting range $A_H$ set up in advance correspondingly to a high vehicle speed region according to the operational input to the volume control switch 3. And the microcomputer section U4 has a memory for storing the first volume setting range $A_L$ setup in advance correspondingly to the low vehicle speed region and the second volume setting range $A_H$ set up in advance correspondingly to the high vehicle speed region.

The microcomputer section U4 controls the operation of the volume control section U2 so as to fix the set volume of the audio system AU at the low vehicle speed region set volume $VM_L$ when detected vehicle speed of the vehicle speed detector Sv is in the low vehicle speed region; continuously changes the set volume according to vehicle speed change-along a predetermined set volume change line $VM_M$ connecting the low vehicle speed region set volume $VM_L$ and the high vehicle speed region set volume $VM_H$ when the detected vehicle speed is in a medium vehicle speed region; and further fix the set volume at the high vehicle speed region set volume $VM_H$ when the detected vehicle speed is in the high vehicle speed region.

In the shown example, the set volume change line $VM_M$ is set as a single straight line with a rising gradient connecting the low vehicle speed region set volume $VM_L$ and the high vehicle speed region set volume $VM_H$, and is stored in the memory of the microcomputer section U4. Furthermore, as at least one of the low vehicle speed region set volume $VM_L$ and the high vehicle speed region set volume $VM_H$ is changed (updated) based on the operational input to the volume control switch 3, the set volume change line $VM_M$ is also changed (updated) accordingly each time.

A lower limit $A_{HMIN}$ of the second volume setting range $A_H$ set up in advance correspondingly to the high vehicle speed region is set higher than an upper limit $A_{LMAX}$ of the first volume setting range $A_L$ set up in advance correspondingly to the low vehicle speed region. Therefore, the set volume change line $VM_M$ connecting the upper limit $A_{LMAX}$ and the lower limit $A_{HMIN}$ does not become a falling gradient.

The initial amplifying section U1, volume control section U2, power amplifying section U3, microcomputer section U4 and power supply section are placed at proper places of the vehicle body, for example, an inner space of the instrument panel 1.

The volume control section U2 constitutes a set volume changer of the present invention capable of increasing and decreasing the set volume of the audio system AU. The microcomputer section U4 constitutes a controller of the present invention for controlling the set volume changer (volume control section U2) based on the operational input to the volume control switch 3 and the detected vehicle speed of the vehicle speed detector Sv.

The microcomputer section U4 (controller), volume control section U2 (set volume changer), volume control switch 3 and vehicle speed detector Sv mutually collaborate to constitute the set volume control device of the present invention capable of automatically controlling the set volume of the audio system AU according to the vehicle speed.

Figure 3:
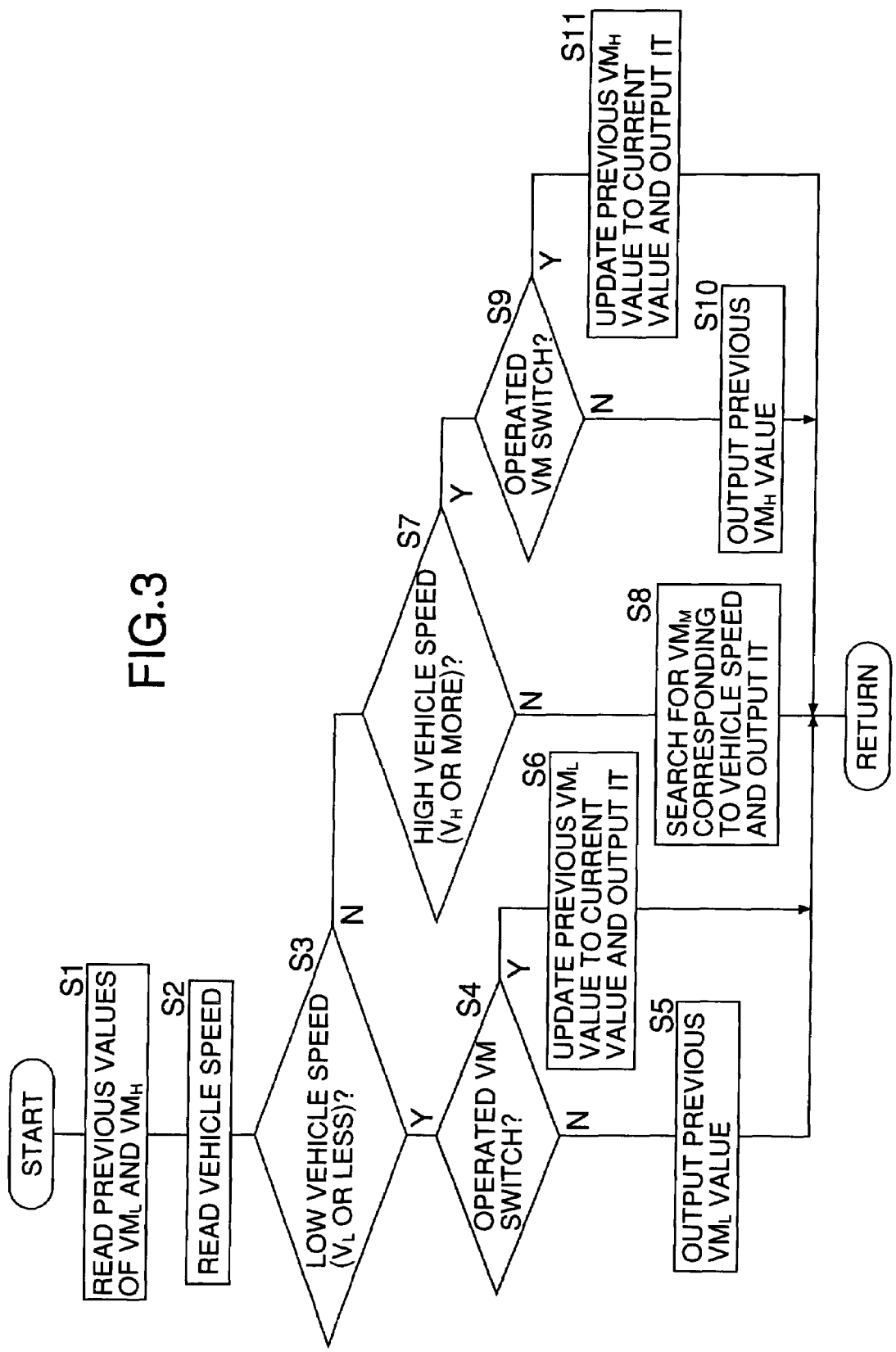
FIG. 3 is a flowchart showing an example of set volume control.
Figure 4:
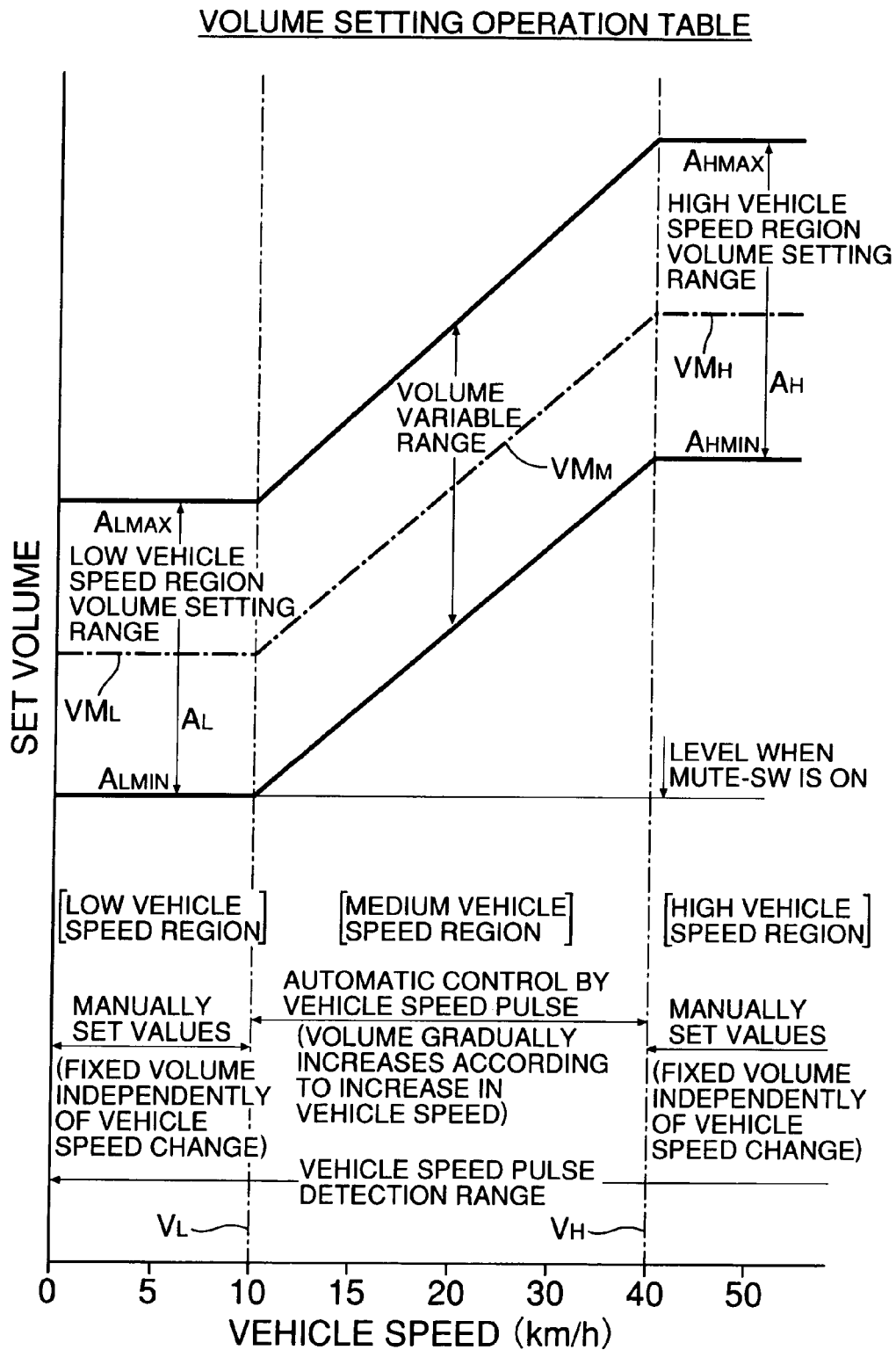
FIG. 4 is a volume setting operation characteristic diagram showing a correlation between vehicle speed and set volume.

Next, a description will be given by referring to FIGS. 3 and 4 together as to a set volume control method by means of the set volume control device of the first embodiment.

In the first embodiment, a vehicle speed V is divided into the low vehicle speed region, high vehicle speed region, and medium vehicle speed region positioned between an upper limit vehicle speed $V_L$ of the low vehicle speed region and a lower limit vehicle speed $V_H$ of the high vehicle speed region. The low vehicle speed region is set to 0 to 10 km/h, the medium vehicle speed region is set to 10 to 40 km/h, and the high vehicle speed region is set to over 40 km/h.

Upon turning on the power switch 2 on the volume controller box C, previous values of the low vehicle speed region set volume $VM_L$ and the high vehicle speed region set volume $VM_H$ are read respectively in a step S1, and the vehicle speed V detected by the vehicle speed detector Sv is read in a step S2.

Next, in a step S3, it is determined whether or not the vehicle speed V is in the low vehicle speed region ($V \leq V_L$). If determined to be in the low vehicle speed region, it moves on to a step S4 to determine whether or not there was the operational input to the volume control switch 3 in the low vehicle speed region by the vehicle occupant. In the case of no operational input, it moves on to a step S5 to output the previous value of the low vehicle speed region set volume $VM_L$ from the microcomputer section U4 to the volume control section U2. Thus, the sound is generated from the speakers Sp at the volume corresponding to the low vehicle speed region set volume $VM_L$ which was set last time.

If determined that there was the operational input to the volume control switch 3 in the low vehicle speed region in the step S4, it moves on to a step S6 to update the low vehicle speed region set volume $VM_L$ based on a new operational input (that is, updating the previous value of the low vehicle speed region set volume $VM_L$ to a current value). That current value is outputted from the microcomputer section U4 to the volume control section U2. Thus, the sound is generated from the speakers Sp at the volume corresponding to the low vehicle speed region set volume $VM_L$ which was updated this time.

In the step S3, if determined that the vehicle speed V is not in the low vehicle speed region ($V \leq L$), it moves on to a step S7 to determine whether or not the vehicle speed V is in the high vehicle speed region ($V_H \leq V$). If determined not to be in the high vehicle speed region (therefore, it is in the medium vehicle speed region), it moves on to a step S8 to determine a medium vehicle speed region set volume $VM_M$ corresponding to the vehicle speed V at that time based on the predetermined set volume change line $VM_M$ connecting the low vehicle speed region set volume $VM_L$ and the high vehicle speed region set volume $VM_H$. The medium vehicle speed region set volume $VM_M$ is outputted from the microcomputer section U4 to the volume control section U2. Thus, the sound is generated from the speakers Sp at the volume corresponding to the set volume $VM_M$.

In the step S7, if determined that the vehicle speed V is in the high vehicle speed region ($V_H \leq V$), it moves on to a step S9 to determine whether or not there was the operational input to the volume control switch 3 in the high vehicle speed region by the vehicle occupant. In the case of no operational input, it moves on to a step S10 to output the previous value of the high vehicle speed region set volume $VM_H$ from the microcomputer section U4 to the volume control section U2. Thus, the sound is generated from the speakers Sp at the volume corresponding to the high vehicle speed region set volume $VM_H$ which was set last time.

If determined that there was the operational input to the volume control switch 3 in the high vehicle speed region in the step S9, it moves on to a step S11 to update the high vehicle speed region set volume $VM_H$ based on a new operational input (that is, to replace the previous value of the high vehicle speed region set volume $VM_H$ with a current value). That current value is outputted from the microcomputer section U4 to the volume control section U2. Thus, the sound is generated from the speakers Sp at the volume corresponding to the high vehicle speed region set volume $VM_H$ which was updated this time.

It returns to a start after the steps S5, S6, S8, S10 and S11 so as to repeat the process.

In the case where the mute switch 4 is pushed at any time in the above, the set volume of the audio system AU is switched to the predetermined feeble volume (the set volume equivalent to a lower limit $A_{LMIN}$ of the first volume setting range $A_L$ in the shown example) irrespective of the set volume at that time. It returns to the original set volume if the mute switch 4 is pushed again.

As is clear from the procedure, according to the first embodiment, when the volume control switch 3 is operated with the vehicle in the low vehicle speed region, it is possible to arbitrarily set the low vehicle speed region set volume $VM_L$ from the first volume setting range $A_L$ set up in advance correspondingly to the low vehicle speed region. Further, when the volume control switch 3 is operated with the vehicle in the high vehicle speed region, it is possible to arbitrarily set the high vehicle speed region set volume $VM_H$ from the second volume setting range $A_H$ set up in advance correspondingly to the high vehicle speed region. However, these settings cannot deviate from the first and second volume setting ranges $A_L$ and $A_H$. Furthermore, in the case where at least one of the low vehicle speed region set volume $VM_L$ and the high vehicle speed region set volume $VM_H$ set up once is set up again (that is, changed) based on the operational input to the volume control switch 3, the set volume change line $VM_M$ is also set up again (that is, changed) accordingly each time.

If the power switch 2 is turned on and the mute switch 4 is not turned on when the vehicle is stopping or running, it is possible, in the low vehicle speed region, to fix and keep the set volume VM of the audio system AU at the low vehicle speed region set volume $VM_L$ independently of the vehicle speed change. Also, it is possible, in the medium vehicle speed region, to continuously change it according to the vehicle speed change along the predetermined set volume change line $VM_M$ connecting the low vehicle speed region set volume $VM_L$ and the high vehicle speed region set volume $VM_H$. Further, it is possible, in the high vehicle speed region, to fix and keep the volume at the high vehicle speed region set volume $VM_H$ independently of the vehicle speed change. The sound is generated from the speakers Sp at the volumes corresponding respectively to the set volumes.

Thus, it is possible, in the medium vehicle speed region [$V_L$ to $V_H$], to continuously change the set volume VM of the audio system AU according to the vehicle speed change along the predetermined set volume change line $VM_M$ connecting the low vehicle speed region set volume $VM_L$ and the high vehicle speed region set volume $VM_H$ arbitrarily set by the vehicle occupant in the low vehicle speed region and the high vehicle speed region respectively. Therefore, it is possible to continuously connect the low vehicle speed region set volume $VM_L$ and the high vehicle speed region set volume $VM_H$ through the volume change line $VM_M$ which represents gradual increase of the volume according to the increase in the vehicle speed, so that feeling of volume change is improved. Furthermore, in the medium vehicle speed region [$V_L$ to $V_H$], the volume increases and decreases corresponding to the increase and decrease of traveling noise with the increase and decrease of the vehicle speed so that the increase rate and decrease rate of the volume substantially correspond to those of the traveling noise, resulting in no uncomfortable feeling.

Furthermore, the low vehicle speed region set volume $VM_L$ is arbitrarily set from the first volume setting range $A_L$ set up in advance correspondingly to the low vehicle speed region, and the high vehicle speed region set volume $VM_H$ is arbitrarily set from the second volume setting range $A_H$ set up in advance correspondingly to the high vehicle speed region respectively. Therefore, in the low vehicle speed region and high vehicle speed region, the vehicle occupant cannot set the volume exceeding the upper limits $A_{LMAX}$ and $A_{HMAX}$ of the volume setting ranges $A_L$ and $A_H$ corresponding to the vehicle speed regions, so that it is possible to accurately control the volume to be comfortably listenable in each of the vehicle speed regions. Furthermore, as the lower limit $A_{HMIN}$ of the second volume setting range $A_H$ set up in advance correspondingly to the high vehicle speed region is higher than the upper limit $A_{LMAX}$ of the first volume setting range $A_L$ set up in advance correspondingly to the low vehicle speed region, it is possible to avoid occurrence of an unnatural situation, such as an increase in the set volume when reducing the vehicle speed from the high vehicle speed region to the low vehicle speed region. It is thus possible to naturally increase and decrease the volume as the vehicle speed becomes high and low.

In the first embodiment, the set volume VM of the audio system AU in the medium vehicle speed region is changed along the set volume change line $VM_M$ comprising only a single straight line connecting the low vehicle speed region set volume $VM_L$ and the high vehicle speed region set volume $VM_H$. However, the set volume change line $VM_M$ is not limited to the single straight line, and may be set to various lines including a curve to suit vehicle characteristics and preference of the user.

For instance, in an example shown in FIG. 5A, at least opposite ends of the set volume change line $VM_M$ are curve portions connected smoothly to the straight lines of the low vehicle speed region set volume $VM_L$ and the high vehicle speed region set volume $VM_H$ respectively, and both the curves are connected smoothly through the straight line or curve so that the start and end of automatic volume setting in the medium vehicle speed region become natural. An example shown in FIG. 5B shows a curve wherein a first half of the medium vehicle speed region rises more steeply than a second half, which particularly suits a vehicle having high road noise. Adversely to the example of FIG. 5B, an example shown in FIG. 5C shows a curve wherein the first half of the medium vehicle speed region is gentle while the second half rises steeply, which particularly suits a vehicle having a high windbreak effect and high maximum speed such as a large and high-speed touring automobile.

Next, the second embodiment of the present invention will be described by referring to FIGS. 6 to 10.

In the second embodiment, the configurations and functions of the volume control section U2 and microcomputer section U4 as a controller are different from the first embodiment. More specifically, the microcomputer section U4 is configured so that, when the volume control switch 3 is operated in the medium vehicle speed region, the high vehicle speed region set volume $VM_H$ can be changed according to the operational input to the volume control switch 3 in the second volume setting range $A_H$, and the medium vehicle speed region set volume change line $VM_M$ can be changed to connect the high vehicle speed region set volume $VM_H$ (after it is changed) and the low vehicle speed region set volume $VM_L$. The volume control section U2 comprises a volume IC capable of switching the volume in a plurality of steps (40 steps in the shown example) according to a command signal from the microcomputer section U4. One of the steps (that is, 1 p) is equivalent to the volume of 2 dB from the speakers in the shown example.

According to this embodiment, the vehicle speed regions are also set as the low vehicle speed region (0 to 10 km/h), medium vehicle speed region (10 to 40 km/h) and high vehicle speed region (over 40 km/h). At the stage of product shipment, the set volume VM is initialized at 18 p (36 dB) as the lower limit of the low vehicle speed region set volume $VM_L$ in the low vehicle speed region and at 39 p (78 dB) as the upper limit of the high vehicle speed region set volume $VM_H$ in the high vehicle speed region respectively.

Figure 6:
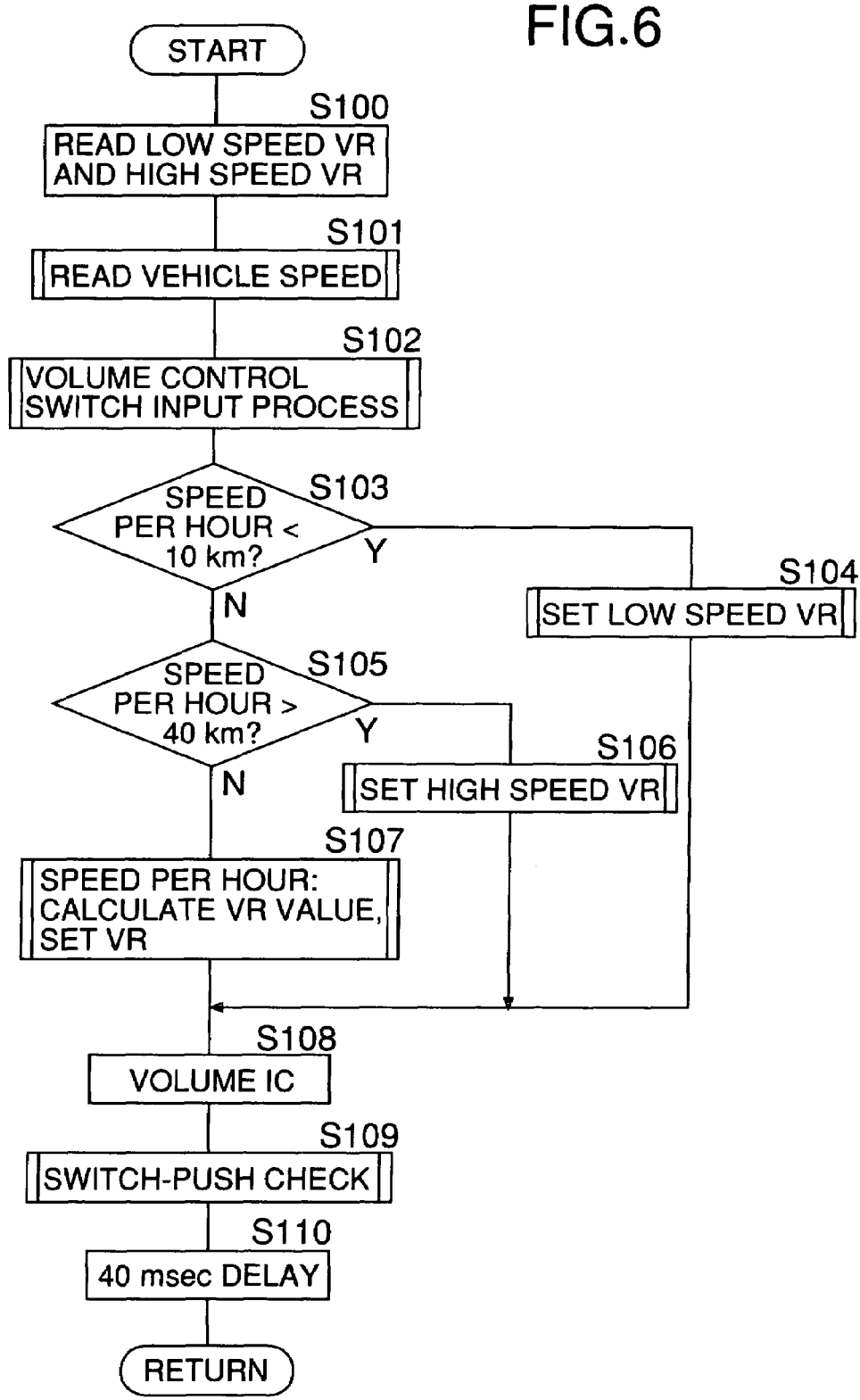
FIG. 6 is a flowchart showing an example of a main control procedure according to a second embodiment of the present invention.
Figure 7:
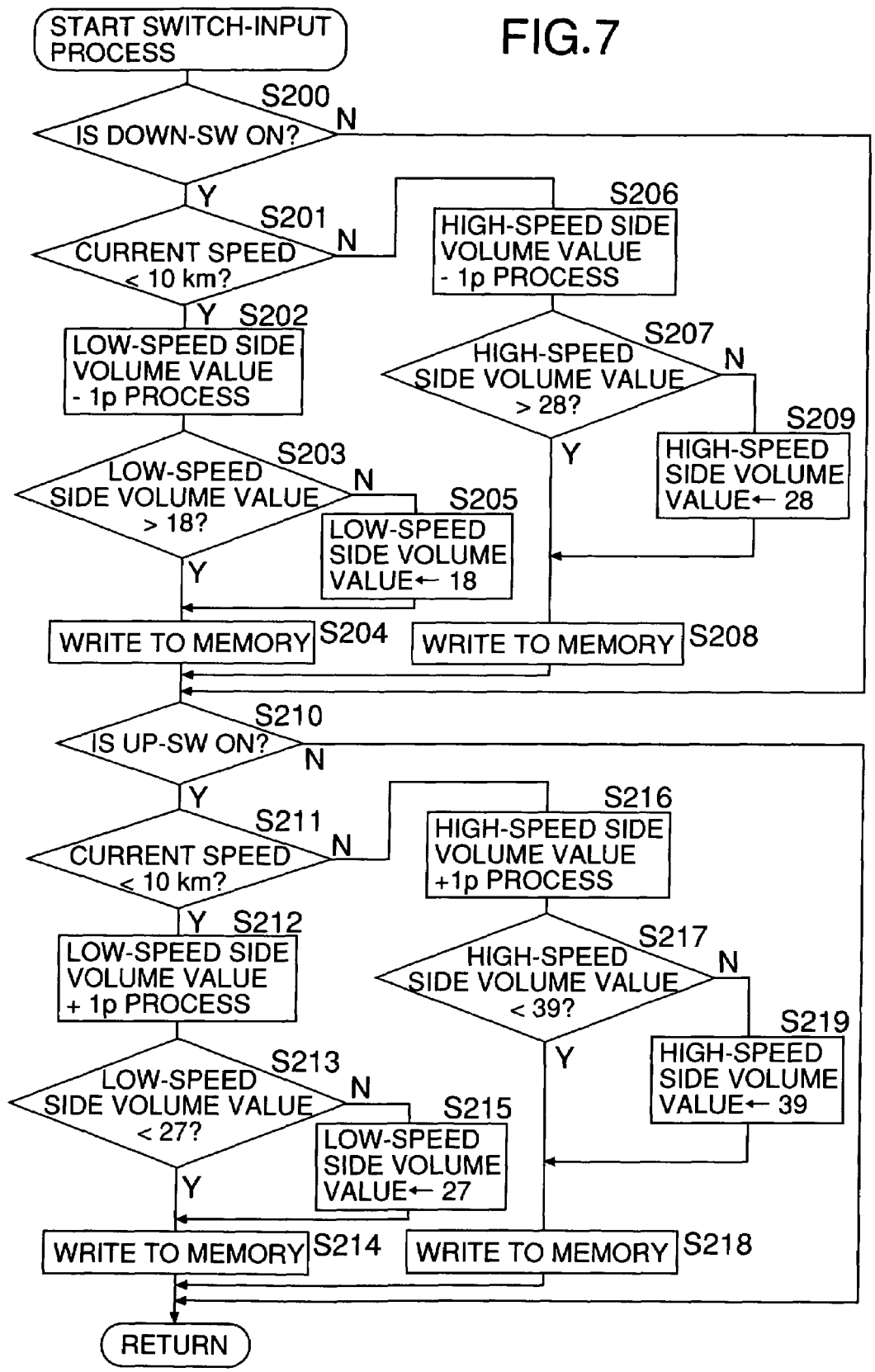
FIG. 7 is a flowchart showing an example of a subroutine for performing an input process of a volume control switch.
Figure 8:
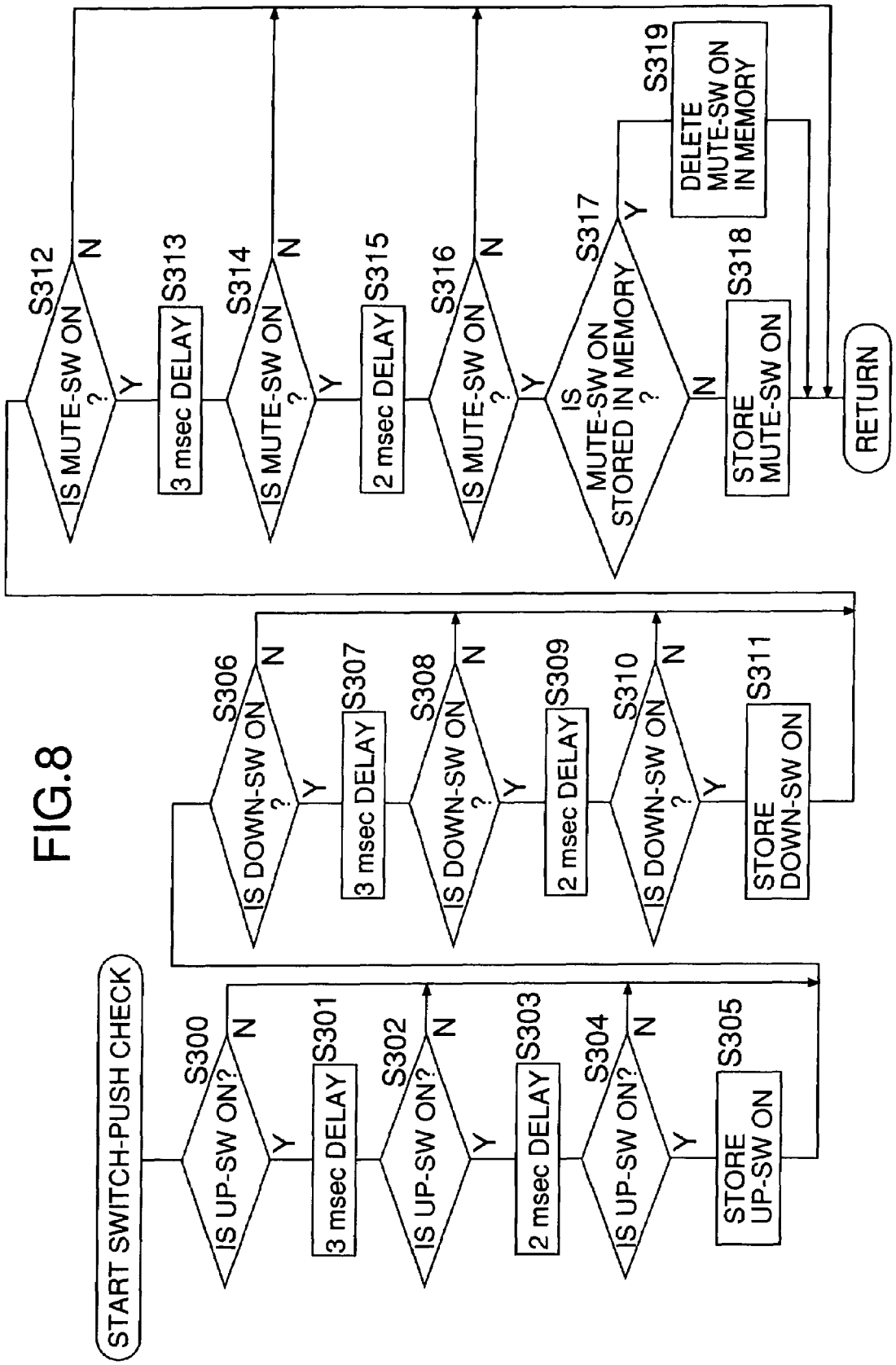
FIG. 8 is a flowchart showing an example of a subroutine for checking switch operation.

Next, a control procedure of the present invention will be described by referring to the flowcharts of FIGS. 6 to 8. If the power switch 2 is turned on in the volume controller box C, the previous values (the initialized values in the product shipment step) of the low vehicle speed region set volume $VM_L$ and the high vehicle speed region set volume $VM_H$ are read from a nonvolatile memory of the microcomputer section U4 in a step S100 first, and the vehicle speed V detected by the vehicle speed detector Sv is subsequently read in a step S101.

Next, in a step S102, the process according to the operational input to the volume control switch 3 is performed. In this process, the high vehicle speed region set volume $VM_H$ and the low vehicle speed region set volume $VM_L$ according to the operational input to the volume control switch 3 are acquired. The process in the step S102 will be described in detail in conjunction with the subroutine of FIG. 7.

Next, in a step S103, it is determined whether or not the vehicle speed is in the low vehicle speed region (less than 10 km/h). If "yes", it moves on to a step S104 to set the set volume VM to the low vehicle speed region set volume $VM_L$ acquired in the step S101. In the case of "no" in the step S103, it moves on to a step S105 to determine whether or not the vehicle speed is in the high vehicle speed region (over 40 km/h). If "yes," it moves on to a step S106 to set the set volume VM to the high vehicle speed region set volume $VM_H$ acquired in the step S101.

In the case of "no" in the step S105, that is, if the vehicle speed is in the medium vehicle speed region, it moves on to a step S107 to set it at the medium vehicle speed region set volume $VM_M$ according to the vehicle speed on the predetermined set volume change line (that is, an inclination pattern described later) connecting the low vehicle speed region set volume $VM_L$ and the high vehicle speed region set volume $VM_H$ acquired in the step S101. In this case, the medium vehicle speed region set volume $VM_M$ according to the vehicle speed can be acquired by performing calculation using a predetermined formula $VM_M=(VM_H-VM_L)\times$(real vehicle speed−10 km/h)/(40 km/h−10 km/h); performing a search from a numerical table created in advance by listing calculated values thereof; or searching a map created in advance for each set volume change line $VM_M$ (inclination pattern) connecting the low vehicle speed region set volume $VM_L$ and the high vehicle speed region set volume $VM_H$.

Next, it moves on to a step S108 to drive a volume IC as the volume control section U2 so that the set volume VM becomes the set volume $VM_L$, $VM_H$ or $VM_M$ set up in one of the steps S104, 106 and 107. Thus, the sound is generated from the speakers Sp at the volume corresponding to the set volume VM ($VM_L$, $VM_H$ or $VM_M$).

Next, it moves on to a step S109 to check push operations of various switches. The process in the step S109 will be described in detail in conjunction with the subroutine of FIG. 8.

Furthermore, it moves on to a step S110 and waits for a predetermined delay time (40 milliseconds for instance) to elapse, and returns to the start so as to repeat that series of processing cycles. The time necessary to perform the processing cycles once is 170 milliseconds or so in the shown example.

Next, the subroutine for performing the process of the step S102 will be described by referring to FIG. 7. First, it is determined whether or not the volume control switch 3 was turned down in a step S200. If not turned down, it moves on to a step S210 described later. If turned down, it moves on to a step S201 to determine whether or not the vehicle speed is in the low vehicle speed region (less than 10 km/h).

If determined that the vehicle speed is in the low vehicle speed region (less than 10 km/h) in the step S201, it moves on to a step S202 to reduce the low vehicle speed region set volume $VM_L$ read in the step S100 only by one step (−1 p). Then, it moves on to a step S203 to determine whether or not the low vehicle speed region set volume $VM_L$ is higher than its lower limit (18 p). If determined to be higher than its lower limit (18 p), it moves on to a step S204 to write the low vehicle speed region set volume $VM_L$ at that time to the memory. Then, it moves on to the step S210.

If determined that the low vehicle speed region set volume $VM_L$ is its lower limit (18 p) or less in the step S203, it moves on to a step S205 to write the lower limit (18 p) as the low vehicle speed region set volume $VM_L$ to the memory. Then, it moves on to the step S210.

If determined that the vehicle speed is not in the low vehicle speed region (less than 10 km/h) in the step S201, it moves on to a step S206 to reduce the high vehicle speed region set volume $VM_H$ read in the step S100 only by one step (−1 p). Then, it moves on to a step S207 to determine whether or not the high vehicle speed region set volume $VM_H$ is higher than its lower limit (28 p) If determined to be higher than its lower limit (28 p), it moves on to a step S208 to write the high vehicle speed region set volume $VM_H$ at that time to the memory. Then, it moves on to the step S210.

If determined that the high vehicle speed region set volume $VM_H$ is its lower limit (28 p) or less in the step S207, it moves on to a step S209 to write the lower limit (28 p) as the high vehicle speed region set volume $VM_H$ to the memory. Then, it moves on to the step S210.

Next, in a step S210, it is determined whether or not the volume control switch 3 was turned up. If not turned up, it moves on to a return. If turned up, it moves on to a step S211 to determine whether or not the vehicle speed is in the low vehicle speed region (less than 10 km/h).

If determined that the vehicle speed is in the low vehicle speed region (less than 10 km/h) in the step S211, it moves on to a step S212 to increase the low vehicle speed region set volume $VM_L$ only by one step (+1 p). Then, it moves on to a step S213 to determine whether or not the low vehicle speed region set volume $VM_L$ is lower than its upper limit (27 p). If determined to be lower than its upper limit (27 p), it moves on to a step S214 to write the low vehicle speed region set volume $VM_L$ at that time to the memory. Then, it moves on to the return.

If determined that the low vehicle speed region set volume $VM_L$ has exceeded its upper limit (27 p) in the step S213, it moves on to a step S215 to write the upper limit (27 p) as the low vehicle speed region set volume $VM_L$ to the memory. Then, it moves on to the return.

If determined that the vehicle speed is not in the low vehicle speed region (less than 10 km/h) in the step S211, it moves on to a step S216 to increase the high vehicle speed region set volume $VM_H$ only by one step (+1 p). Then, it moves on to a step S217 to determine whether or not the high vehicle speed region set volume $VM_H$ is lower than its upper limit (39 p). If determined to be lower than its upper limit (39 p), it moves on to a step S218 to write the high vehicle speed region set volume $VM_H$ at that time to the memory. Then, it moves on to the return.

If determined that the high vehicle speed region set volume $VM_H$ is not lower than its upper limit (39 p) in the step S217, it moves on to a step S219 to put "39" into the high vehicle speed region set volume $VM_H$, and moves on to the step S218 to write the high vehicle speed region set volume $VM_H$ to the memory. Then, it moves on to the return.

Next, the subroutine for performing the process of the step S109 will be described by referring to FIG. 8. First, it is determined whether or not the volume control switch 3 continues to be turned up in a step S300. If not being turned up, it moves on to a step S306. If being turned up, it moves on to a step S301 and waits for a predetermined delay time (3 milliseconds for instance) to elapse. Then, it moves on to the step S302.

In the step S302, it is determined again whether or not the volume control switch 3 continues to be turned up. If not being turned up, it moves on to a step S306. If being turned up, it moves on to a step S303 and waits for a predetermined delay time (2 milliseconds for instance) to elapse. Then, it moves on to the step S304.

In the step S304, it is determined again whether or not the volume control switch 3 continues to be turned up. If not being turned up, it moves on to a step S306. If being turned up, it moves on to a step S305 to store a status of being turned up in the memory. Then, it moves on to the step S306.

Next, it is determined whether or not the volume control switch 3 continues to be turned down in a step S306. If not being turned down, it moves on to a step S312. If being turned down, it moves on to a step S307 and waits for a predetermined delay time (3 milliseconds for instance) to elapse. Then, it moves on to the step S308.

In the step S308, it is determined again whether or not the volume control switch 3 continues to be turned down. If not being turned down, it moves on to a step S312. If being turned down, it moves on to a step S309 and waits for a predetermined delay time (2 milliseconds for instance) to elapse. Then, it moves on to the step S310.

In the step S310, it is determined again whether or not the volume control switch 3 continues to be turned down. If not being turned down, it moves on to a step S312. If being turned down, it moves on to a step S311 to store a status of being turned down in the memory. Then, it moves on to the step S312.

Next, it is determined whether or not the mute switch 4 continues to be turned on in a step S312. If not being turned on, it moves on to the return. If being turned on, it moves on to a step S313 and waits for a predetermined delay time (3 milliseconds for instance) to elapse. Then, it moves on to the step S314.

In the step S314, it is determined again whether or not the mute switch 4 continues to be turned on. If not being turned on, it moves on to the return. If being turned on, it moves on to a step S315 and waits for a predetermined delay time (2 milliseconds for instance) to elapse. Then, it moves on to the step S316.

In the step S316, it is determined again whether or not the mute switch 4 continues to be turned on. If not being turned on, it moves on to the return. If being turned on, it moves on to a step S317 to determine whether or not a state of the mute switch 4 being turned on is stored in the memory. If not stored, it moves on to a step S318 to store the state of being turned on in the memory, and then moves on to the return. If it is determined at the step S317 that the state of the mute switch 4 being turned on is stored in the memory, it moves on to a step S319 to delete the state in the memory, and then moves on to the return.

By performing the above-described switch operation check, it is possible to accurately judge a switch operating intention of the vehicle occupant so as to keep the set volume from being changed in vain by an instantaneous switch operation error.

Figure 9:
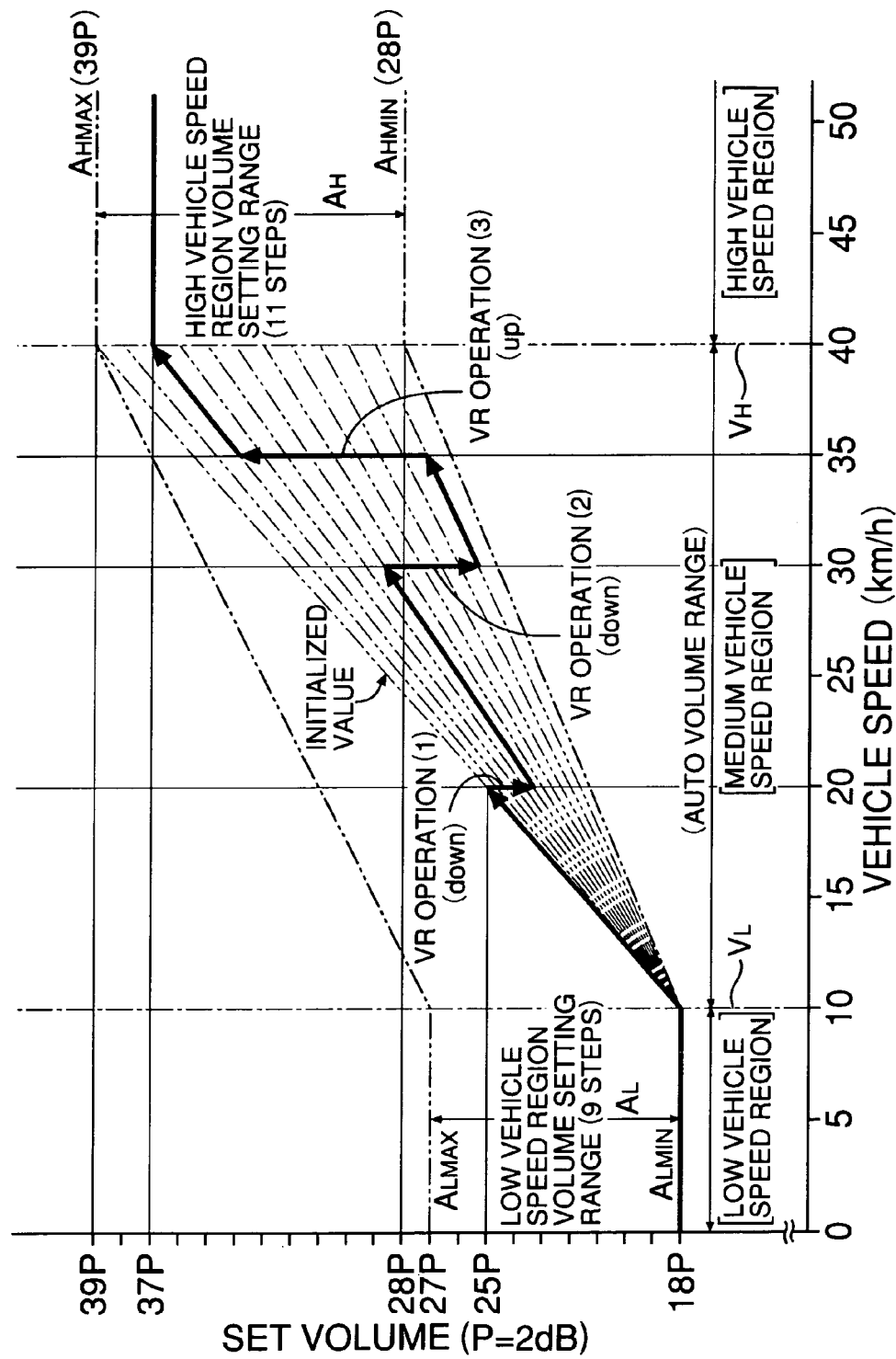
FIG. 9 is a volume setting operation characteristic diagram corresponding to FIG. 4 showing an example of manual operation.

In the second embodiment, the operation is as shown in FIGS. 9 and 10, for instance, especially in the case where the volume control switch 3 is turned up or down in the medium vehicle speed region when the vehicle is running in a state in which the set volume VM is initialized to 18 p (36 dB) as the lower limit of the low vehicle speed region set volume $VM_L$ in the low vehicle speed region and 39 p (78 dB) as the upper limit of the high vehicle speed region set volume $VM_H$ in the high vehicle speed region respectively.

More specifically, in the case where the volume control switch 3 is turned down only by five steps at the speed of 20 km/h (1) in FIG. 9, the high vehicle speed region set volume $VM_H$ shifts from 39 p to 34 p, so that the inclination pattern connecting the low vehicle speed region set volume $VM_L$ and the high vehicle speed region set volume $VM_H$ shifts from [18 p→39 p] till then to [18 p→34 p]. Thereafter, the set volume $VM_M$ according to the vehicle speed is set in this inclination pattern. In the case where the volume control switch 3 is turned down by five steps at the speed of 30 km/h (2) thereafter, the high vehicle speed region set volume $VM_H$ shifts from 34 p to 29 p, so that the inclination pattern shifts to [18 p→29 p]. Thereafter, the set volume $VM_M$ according to the vehicle speed is set in this inclination pattern. In the case where the volume control switch 3 is turned up by eight steps at the speed of 35 km/h (3) thereafter, the high vehicle speed region set volume $VM_H$ shifts from 29 p to 37 p, so that the inclination pattern shifts to [18 p→37 p]. Thereafter, the set volume $VM_M$ according to the vehicle speed is set in this inclination pattern. The low vehicle speed region set volume $VM_L$ and the high vehicle speed region set volume $VM_H$ thus set up are stored in the memory of the microcomputer section U4, even if the power switch 2 is turned off. Therefore, the set volume $VM_M$ is set thereafter according to the vehicle speed in the medium vehicle speed region in the inclination pattern of [18 p→37 p]. The set volume $VM_M$ is fixed at the high vehicle speed region set volume $VM_H$ (37 p) in the high vehicle speed region, and at the low vehicle speed region set volume $VM_L$ (18 p) in the low vehicle speed region.

FIG. 10 also shows another operation example. More specifically, the inclination pattern connecting the low vehicle speed region set volume $VM_L$ and the high vehicle speed region set volume $VM_H$ shifts from [27 p→30 p] till then to [27 p→34 p] especially in the case where the volume control switch 3 is turned up by four steps at the speed of 20 km/h (1') in the medium vehicle speed region when the vehicle is running in a state in which the low vehicle speed region set volume $VM_L$ is set to 27 p and the high vehicle speed region set volume $VM_H$ is set to 30 p respectively. In the case where the volume control switch 3 is turned up by three steps at the speed of 30 km/h (2') thereafter, the inclination pattern shifts to [18 p→37 p]. In the case where the volume control switch 3 is turned down by six steps at the speed of 35 km/h (3') thereafter, the inclination pattern shifts to [18 p→31 p].

In the second embodiment, the microcomputer section U4 as the controller shifts the high vehicle speed region set volume $VM_H$ according to the operational input to the volume control switch 3 when the volume control switch 3 is operated in the medium vehicle speed region (that is, the microcomputer section U4 changes the high vehicle speed region set volume $VM_H$ within the second volume setting range $A_H$ according to the operational input to the volume control switch 3, and changes the medium vehicle speed region set volume change line $VM_M$ (inclination pattern) to connect the high vehicle speed region set volume $VM_H$ (after it is changed) and the low vehicle speed region set volume $VM_L$ which is not changed). However, the present invention is also applicable to the cases where the low vehicle speed region set volume $VM_L$ is shifted according to the operational input to the volume control switch 3 when operated in the medium vehicle speed region (that is, the microcomputer section U4 changes the low vehicle speed region set volume $VM_L$ within the first volume setting range $A_L$ according to the operational input to the volume control switch 3, and changes the medium vehicle speed region set volume change line $VM_M$ (inclination pattern) to connect the low vehicle speed region set volume $VM_L$ (after it is changed) and the high vehicle speed region set volume $VM_H$ which is not changed). Furthermore, the present invention is also applicable to the cases where both the low vehicle speed region set volume $VM_L$ and high vehicle speed region set volume $VM_H$ are shifted according to the operational input to the volume control switch 3 when the volume control switch 3 is operated in the medium vehicle speed region (that is, the microcomputer section U4 changes the high vehicle speed region set volume $VM_H$ within the second volume setting range $A_H$ and the low vehicle speed region set volume $VM_L$ within the first volume setting range $A_L$ according to the operational input to the volume control switch 3 respectively, and changes the medium vehicle speed region set volume change line $VM_M$ (inclination pattern) to connect the low vehicle speed region set volume $VM_L$ and the high vehicle speed region set volume $VM_H$ (after it is changed)). The technique of changing the low vehicle speed region set volume $VM_L$ and/or the high vehicle speed region set volume $VM_H$ in these modified examples are the same as that of the second embodiment.

Although the embodiments of the present invention have been described above, the present invention is not limited thereto, and various embodiments may be made within the subject matter of the invention.

For instance, the embodiments show the audio system according to the present invention mounted on the two-wheeled motor vehicle, however, the vehicles on which the audio system is mounted are not limited to the two-wheeled motor vehicles, and the present invention is also applicable to automobiles and motortricycles for instance.

In the embodiments, the medium vehicle speed region setting range [$V_L$ to $V_H$] is set to the range most appropriate in the case of assuming an ordinary town drive, that is, [10 to 40 km/h]. However, the medium vehicle speed region setting range [$V_L$ to $V_H$] of the present invention is not limited to such a range, and may be set up as appropriate according to the characteristics of the vehicles on which the audio system AU is mounted. For instance, on the assumption that the upper limit vehicle speed $V_L$ of the low vehicle speed region is lower than the lower limit vehicle speed $V_H$ of the high vehicle speed region, it is possible to set the upper limit vehicle speed $V_L$ of the low vehicle speed region to 0 to 40 km/h and the lower limit vehicle speed $V_H$ of the high vehicle speed region to 20 km/h or higher according to the characteristics of the vehicles.

In the embodiments, the volume control switch 3 increases and decreases the set volume by manipulating a single operation knob up and down. According to the present invention, however, it is also possible to use the volume control switch having an operation knob exclusively for turning up and an operation knob exclusively for turning down.

In the second embodiment, the medium vehicle speed region set volume change line $VM_M$ (inclination pattern) is the straight line connecting the low vehicle speed region set volume $VM_L$ and the high vehicle speed region set volume $VM_H$. However, it is also possible to use various lines including a curve instead of the straight line as in the modified examples of the first embodiment (FIG. 5).

Further, in the embodiments, straight lines and curves illustrated as the medium vehicle speed region set volume change lines $VM_M$ are straight lines and curves extending without any step. However, they may be zigzag lines changing stepwise little by little (that is, with relatively small (e.g., 2 dB) steps) and substantially similar to straight lines or curves. Therefore, in the sixth feature, "a straight line or a curve" should be interpreted to include a zigzag line changing stepwise little by little and substantially similar to a straight line or a curve.

What is claimed is:

1. A set volume control device for an on-vehicle audio system having a set volume changer for increasing and decreasing a set volume of the audio system, and capable of controlling the set volume changer to automatically control the set volume of the audio system according to vehicle speed, the device further comprising:
a vehicle speed detector for detecting vehicle speed;
a volume control switch to which a vehicle occupant can arbitrarily give an operational input; and
a controller for controlling the set volume changer based on a vehicle speed detected by the vehicle speed detector and the operational input to the volume control switch so that the set volume of the audio system becomes a low vehicle speed region set volume fixed independently of vehicle speed change in a low vehicle speed region of an upper limit vehicle speed or less; becomes a high vehicle speed region set volume fixed independently of the vehicle speed change in a high vehicle speed region of a lower limit vehicle speed or more; and changes according to the vehicle speed change along a predetermined medium vehicle speed region set volume change line connecting the low vehicle speed region set volume and the high vehicle speed region set volume in a medium vehicle speed region between the low vehicle speed region and the high vehicle speed region,
wherein the controller changes the low vehicle speed region set volume according to an operational input to the volume control switch within a first volume setting range set up in advance when the volume control switch is operated in the low vehicle speed region, and changes the high vehicle speed region set volume according to an operational input to the volume control switch within a second volume setting range set up in advance when the volume control switch is operated in the high vehicle speed region, and wherein a lower limit of the second volume setting range is set higher than an upper limit of the first volume setting range.

2. The set volume control device for an on-vehicle audio system according to claim 1, wherein the controller changes the high vehicle speed region set volume according to the operational input to the volume control switch within the second volume setting range when the volume control switch is operated in the medium vehicle speed region, and changes the medium vehicle speed region set volume change line so as to connect the high vehicle speed region set volume after it is changed and the low vehicle speed region set volume.

3. The set volume control device for an on-vehicle audio system according to claim 1, wherein the controller changes the low vehicle speed region set volume according to the operational input to the volume control switch within the first volume setting range when the volume control switch is operated in the medium vehicle speed region, and changes the medium vehicle speed region set volume change line so as to connect the low vehicle speed region set volume after it is changed and the high vehicle speed region set volume.

4. The set volume control device for an on-vehicle audio system according to claim 1, wherein the controller changes the high vehicle speed region set volume according to the operational input to the volume control switch within the second volume setting range and the low vehicle speed region set volume within the first volume setting range, respectively, when the volume control switch is operated in the medium vehicle speed region, and changes the setting of the medium vehicle speed region set volume change line so as to connect the high vehicle speed region set volume and the low vehicle speed region set volume after it is changed.

5. The set volume control device for an on-vehicle audio system according to claim 1, 2 or 3, wherein, upon turning up or down operation of the volume control switch, the controller confirms at least once that the same operation is performed when a predetermined time elapses after the turning up or down, and then handles the operational input as effective.

6. The set volume control device for an on-vehicle audio system according to claim 1, 2 or 3, wherein, in the medium vehicle speed region set volume change line, at least opposite ends thereof are formed as curve portions connected smoothly to the straight lines of the high vehicle speed region set volume and the low vehicle speed region set volume, respectively, and both the curve portions are connected together smoothly through a straight line or a curve.

* * * * *